(12) United States Patent
Takla

(10) Patent No.: US 6,295,327 B1
(45) Date of Patent: *Sep. 25, 2001

(54) METHOD AND APPARATUS FOR FAST CLOCK RECOVERY PHASE-LOCKED LOOP WITH TRAINING CAPABILITY

(75) Inventor: Ashraf K. Takla, San Jose, CA (US)

(73) Assignee: Hitachi Micro Systems, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/370,606

(22) Filed: Aug. 10, 1999

Related U.S. Application Data

(63) Continuation of application No. 08/733,869, filed on Oct. 17, 1996, now Pat. No. 6,044,123.

(51) Int. Cl.[7] .................................................. H03D 3/24
(52) U.S. Cl. ........................... 375/375; 375/376; 331/25; 327/147; 327/156; 327/163
(58) Field of Search ..................................... 375/373–375, 375/376; 331/18, 25; 327/5, 7, 39, 148, 157, 147, 156, 163

(56) References Cited

U.S. PATENT DOCUMENTS

| | | | |
|---|---|---|---|
| 4,069,462 | * | 1/1978 | Dunn ...................................... 331/11 |
| 5,525,935 | * | 6/1996 | Joo et al. ............................... 331/11 |
| 5,610,954 | * | 3/1997 | Miyashita et al. .................... 375/375 |
| 5,610,955 | * | 3/1997 | Bland .................................... 375/376 |
| 5,787,135 | * | 7/1998 | Clark ..................................... 375/376 |
| 5,987,085 | * | 11/1999 | Anderson ............................. 375/374 |

* cited by examiner

Primary Examiner—Amanda T. Le
(74) Attorney, Agent, or Firm—Squire Sanders & Dempsey L.L.P.

(57) ABSTRACT

A phase-locked loop with training capability that reduces the time for clock recovery of a clock signal at a known frequency embedded in a data signal. Prior to the data signal being available, the phase-locked loop, in a training mode, acquires frequency and phase lock with a local oscillator signal. As a result, the output of the PLL is frequency locked substantially at the frequency of the clock embedded in the expected data signal. To achieve this result, in the training mode, the PLL compares the local oscillator signal divided by a first divider with the output clock signal divided by a second divider. Then the frequency of the output clock signal of the PLL equals the frequency of the local oscillator multiplied by the ratio of the divisor of the second divider over the divisor of the first divider. When the data signal is available, the PLL operates in a data receiving mode. In that mode, the PLL typically only needs to acquire phase lock, since frequency lock already has been acquired in the training mode.

5 Claims, 3 Drawing Sheets

METHOD AND APPARATUS FOR FAST CLOCK RECOVERY PHASE-LOCKED LOOP WITH TRAINING CAPABILITY

CROSS-REFERENCE TO RELATED APPLICATION

This application is a continuation of U.S. application Ser. No. 08/733,869, filed on Oct. 17, 1996, now U.S. Pat. No. 6,044,123, incorporated herein by reference.

BACKGROUND OF THE INVENTION

Phase-locked loops (PLL) find many applications. Among them is their use for recovering a clock signal out of a data signal stream. FIG. 1 shows a phase-locked loop (PLL) 110. In PLL 110, data 114 is coupled to a pulse gate circuit 120 also known as a pulse removing circuit. The pulse gate circuit 120 is connected to a phase-frequency detector 118. The phase-frequency detector 118 is coupled to a charge pump 122, which in turn is coupled to a loop filter 126. The loop filter is coupled to a voltage controlled oscillator (VCO) 130. A feedback link 146 connects the output of the VCO 130 to the phase-frequency detector 118, as shown in FIG. 1. The VCO 130 has an output 134 for coupling a recovered clock signal 136 to a memory 138. The data 114 also is coupled directly to the memory 138 via data link 142. The recovered clock signal 136 clocks data 114 into memory 138.

A typical application of the PLL 110 may be in a hard disk drive system. In the standard hard disk drive system, data needs to be sent from a disk drive 150 to memory 138 of, for example, a microprocessor. An example of data sent from disk drive 150 is servo data. Servo data contains positioning information of a head of a disk drive 150 with respect to the disk of the disk drive 150.

Clock signal information associated with data 114 is embedded in the data signal 114. In fact, such clock information may be available from voltage transitions of the data signal 114. Transmitting clock information along with the data 114 on data signal link 154 obviates the need for an extra link for the clock signal. Sometimes, an extra link is not even available, as in the case of a serial link, such as an RS-232 (Recommended Standard-232 ) link. RS-232 is a standard for serial transmission between computers and peripheral devices. Whether data is sent over serial or parallel data channels, in synchronous systems, clock information is needed for receiving the data. So embedded clock signal information has to be recovered from the data 114. This clock recovery is performed by PLL 110. PLL 110 frequency and phase locks onto the embedded clock signal information.

To minimize frequency and phase errors between the actual clock signal and the recovered clock signal 136, the recovered clock signal 136 is fed back via feedback link 146 to the pulse gate circuit 120. The pulse gate circuit 120 passes through a VCO pulse every time it receives a pulse on data signal link 154. The pulse gate circuit 120 transmits the recovered clock signal 136 to the phase-frequency detector 118. The phase-frequency detector 118 minimizes phase and frequency differences between the clock signal associated with data 114 and the recovered clock signal 136. When the PLL 110 is in a locked state, then the phase and frequency error between the recovered clock signal 136 and the clock signal in the data 114 is very small or zero.

The PLL 110 can lose lock. Loss of lock is the state of the PLL when the phase and frequency differences between the recovered clock signal 136 and the clock of the data signal 114 have become substantial. A loss of lock of PLL 110 can occur, for instance, when, in a particular data transmission format, data signal logic ones are transmitted as low to high to low voltage transitions, whereas logic zeros are represented by no transitions. So, when there is an extended series of logic zeros being transmitted, the PLL 110 is likely to lose lock, because an indication of the clock signal in data signal 114 is unavailable for that time.

Once lock is lost, the frequency of the signal at output 134 of VCO 130 drifts away from the clock of data signal 114. Depending on the particular output frequency range capability of the VCO 130, the frequency of the signal at the output 134 of the VCO 130 can drift significantly far away from the clock of data signal 114. Consequently, once data signal 114 again includes logic ones, i.e., low to high to low voltage transitions, PLL 110 will have to reacquire lock. Such reacquisition requires time and can significantly slow the transfer of data 114 from disk drive 150 to memory 138. The further away the frequency of the signal at the output 134 can drift from the clock associated with data signal 114, the more time the PLL 110 will need to reacquire lock.

To minimize the time required for reacquiring lock, PLLs 110 are designed with VCOs 130 that have a narrow output frequency range centered on the expected frequency, i.e., center frequency, of the clock associated with data 114. Usually, the frequency at which data 114 is clocked is known. However, a problem associated with the narrow output frequency range approach is that VCOs 130 may have considerably varying center frequencies. The center frequency of the VCO 130 can vary by as much as 100 percent. So, for instance, for a desired VCO output frequency of 50 MHz (mega-hertz), the actual center frequency may be 100 MHz. These variations are due to VCO manufacturing process tolerances. As a result, some VCOs 130 may be unable to provide a recovered clock signal 136 at the clock frequency of data 114.

To overcome the problem of the output frequency range of the VCO 130 possibly being outside that of the clock of data signal 114, VCO 130 can be tuned for operation over the desired frequency range. This tuning can involve trimming of components of the VCO 130, such as, for instance, switching in or out certain components, like resistors.

To avoid the need for tuning VCO 130, an alternative approach to minimizing time for reacquiring lock of PLL 110, is to manufacture VCO 130 with a relatively wide frequency range, such that none of the process variations will remove the output frequency range of the VCO 130 from coverage of the clock frequency of data 114.

But, as discussed above, widening of the range of output frequency range of the VCO 130, permits VCO 130 to drift further away from the clock frequency of the data 114 than a VCO 130 could that has a relatively narrow output frequency range. To minimize the lock reacquisition time of PLL 110, a master PLL can be used to keep VCO 130 at the frequency of the clock of data 114 during periods when PLL 110 has lost lock. In this arrangement, the PLL 110 of FIG. 1 becomes a slave PLL. The VCO 130 of this slave PLL 110 is controlled by the master PLL.

The approaches discussed above, while feasible, are costly in terms of testing time and silicon area. The VCO 130 with a narrow output frequency range requires trimming of VCO components and testing to assure that it has been trimmed appropriately. Furthermore, in the system that includes the master PLL, additional silicon area on a chip has to be made available for this master PLL.

BRIEF SUMMARY OF THE INVENTION

The invention includes a phase-locked loop (PLL) with training capability. Having training capability, reduces the PLL's time for acquiring frequency lock. In a training mode, the PLL functions to lock in frequency and phase to a training clock signal of a local oscillator at a frequency at which a data signal is expected to be clocked. Locking onto the training clock signal during the training mode eliminates the PLL's need for time consuming locking onto the frequency of the clock signal of the data signal, once the data signal become available. By interposing a divider between the local oscillator and one input of the phase-frequency detector and another divider between the output of a voltage controlled oscillator (VCO) and another input of the phase-frequency detector, the PLL in its training mode can lock closely to the frequency of the clock signal of the data signal.

From a system point of view, in a preferred embodiment, the phase-locked loop comprises a first multiplexer for receiving a first signal and a second signal. In addition, the phase-locked loop comprises a phase-frequency detector coupled to the first multiplexer and a voltage controlled oscillator coupled to the phase-frequency detector. The phase-locked loop further includes a pulse gate circuit coupled between the phase-frequency detector and the first multiplexer.

From a process point of view, a preferred embodiment is a method for acquiring frequency and phase lock. The method comprises the steps of receiving a local oscillator signal, receiving an output clock signal, and comparing the frequency of the local oscillator signal with the frequency of the output clock signal. The method further comprises the steps of adjusting the frequency of the output clock signal based on the differences in frequencies between the output clock signal and the local oscillator signal, receiving a data signal, and comparing the phase of the data signal with the phase of the output clock signal. In addition, the method includes the step of adjusting the frequency of the output clock signal based on the comparison of the phase of the data signal with the phase of the output clock signal.

DETAILED DESCRIPTION OF THE PREFERRED EMBODIMENTS

The invention includes a phase-locked loop (PLL) with training capability. Having training capability reduces the PLL's time for acquiring frequency lock. In a training mode, the PLL functions to lock in frequency and phase to a training clock signal of a local oscillator at a frequency at which a data signal is expected to be clocked. Locking onto the training clock signal during the training mode eliminates the PLL's need for time consuming locking onto the frequency of the clock signal of the data signal, once the data signal become available. By interposing a divider between the local oscillator and one input of the phase-frequency detector and another divider between the output of a voltage controlled oscillator (VCO) and another input of the phase-frequency detector, the PLL in its training mode can lock closely to the frequency of the clock signal of the data signal.

Figure 1:
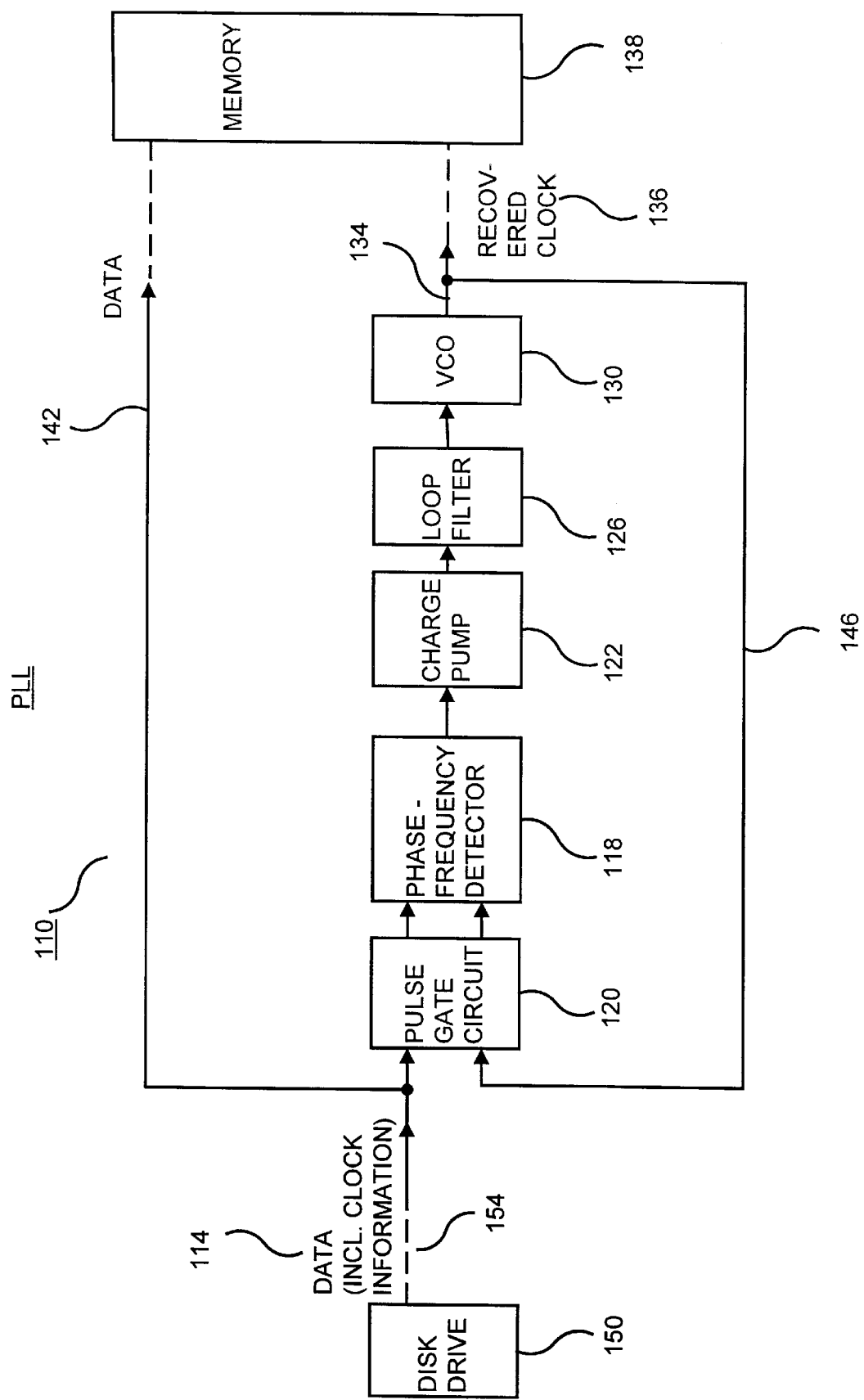
FIG. 1 is a block diagram of a phase-locked loop.
Figure 2:
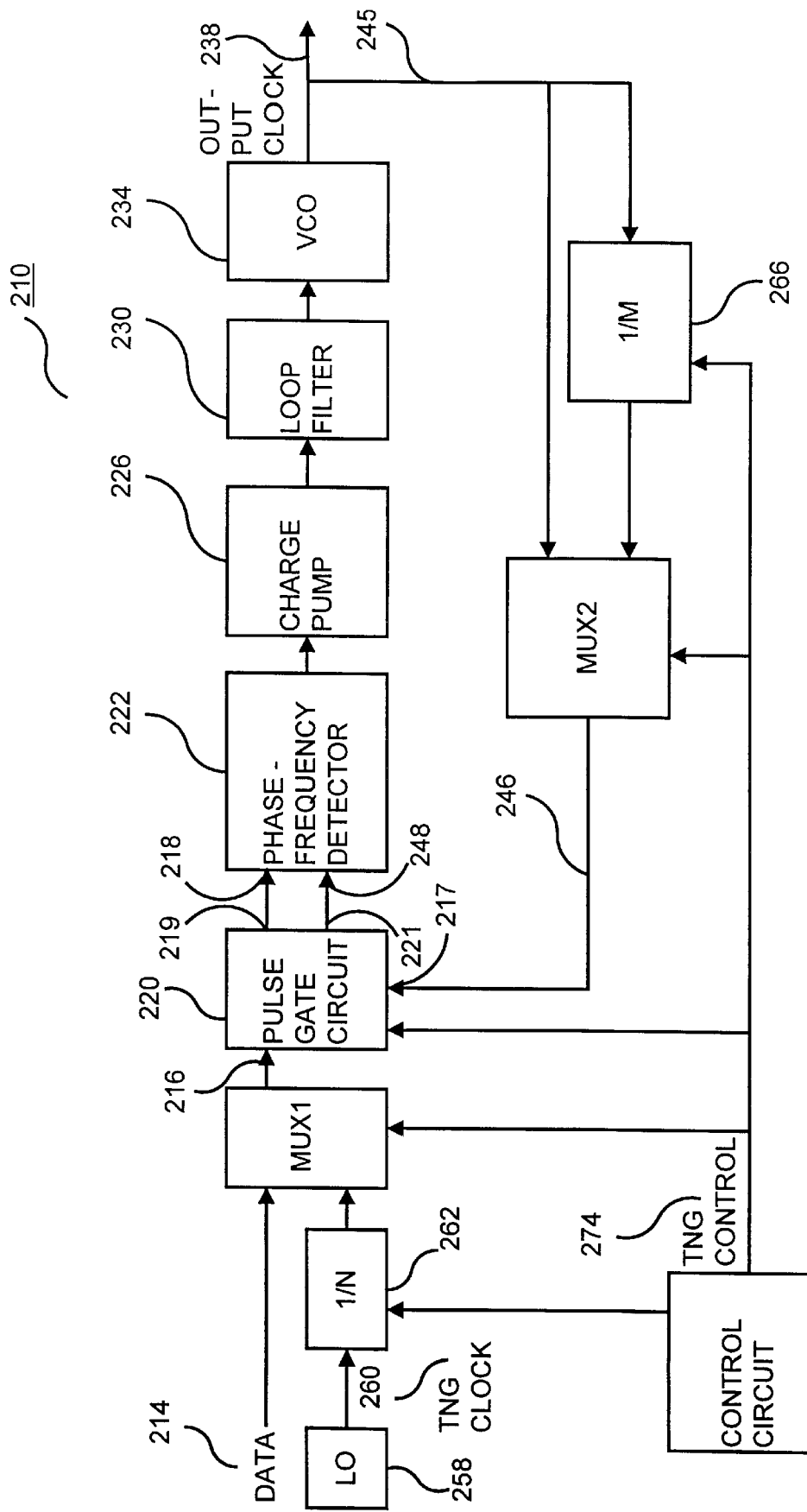
FIG. 2 is a block diagram of a phase-locked loop with training capability, in accordance with a preferred embodiment of the invention.

FIG. 2 is a block diagram of a PLL 210 with training capability. PLL 210 can switch between the training mode and a data receiving mode for receiving data signal 214, as further discussed below. In FIG. 2, a data signal 214 includes embedded clock signal information. This clock signal information reflects the clock signal with which the data signal 214 is clocked from, for instance, disk drive 150 (See FIG. 1) to memory 138.

Data signal 214 is input to a multiplexer MUX1. An output of MUX1 is connected to a first input 216 of a pulse gate circuit 220. A first output 219 of the pulse gate circuit 220 connects to a first input 218 of a phase-frequency detector 222, which in turn is connected to an optional charge pump 226. The charge pump 226 is connected to a passive analog loop filter 230. The loop filter 230 removes phase jitters in the data signal 214.

Instead of charge pump 226 and a passive loop filter 230, an active analog loop filter can be used. An active loop filter typically includes one or more operational amplifiers, whereas the loop filter 230 includes only passive elements, such as resistors and capacitors. Based on the description herein, it will be clear to one of ordinary skill in the art that other configurations also can be used, such as a passive loop filter without a charge pump 226. An output of loop filter 230 is connected to the VCO 234. An output of the VCO 234 provides an output clock signal 238. The output clock signal 238 is coupled to a multiplexer MUX2 via a feedback link 245. A feedback link 246 connects an output of MUX2 to a second input 217 of pulse gate circuit 220. A second output 221 of pulse gate circuit 220 connects to a second input 248 of phase-frequency detector 222.

To implement the training capability of PLL 210, in the training mode, a local oscillator 258 provides a training clock signal 260 to a divider 262. Divider 262 can be implemented with a counter. Preferably, divider 262 is programmable. Divider 262 is connected to MUX1. Similarly, the output clock signal 238 is connected to a divider 266. As divider 262, divider 266 preferably is programmable. Programmable dividers are discussed in Chapter 8 entitled "CMOS Subsystem Design" of the Second Edition of *Principles of CMOS VLSI Design, A System Perspective* by N. H. E. Weste & K. Eshraghiain, published by Addison-Wesley Publishing Company, 1994, which is hereby incorporated by reference. Divider 266 is connected to MUX2. A control circuit 270 provides a training control signal 274 to MUX1 and MUX2. In addition, control circuit 270 controls dividers 262, 266. So, control circuit 270 can select divisors N, M depending on the output clock signal frequency in a particular application, as further explained below.

The PLL 210 functions as follows. Initially, PLL 210 does not have frequency and phase lock with the clock signal associated with data signal 214. Lack of such lock could be due to, for instance, a sudden and extended interruption in data signal 214. As a result, without the training capability, the frequency of the output clock signal 238 of VCO 234 will tend to drift away from the frequency of the clock of data signal 214.

To prepare the PLL 210 for a resumption of transmission of data signal 214, the control circuit 270 switches MUX1 for transmitting to the phase-frequency detector 222 the training clock signal 260 of local oscillator 258 divided by divider 262. Similarly, the control circuit 270 switches MUX2 for transmitting the output clock signal 238 divided by divider 266 to phase-frequency detector 222.

To know when to switch MUX1 and MUX2, the control circuit 270 monitors data clocked with the recovered clock signal 238 and received from data link 142 (see FIG. 1).

Such data typically is recovered from an output of a type D flip-flop, where the type D flip-flop is clocked with the recovered clock signal 238. Periodically, the control circuit 270 switches to the data receiving mode and monitors the recovered data for a system pattern. Once the control circuit 270 discovers the system pattern, then the control circuit 270 remains in the data receiving mode. Should the control circuit 270 not discover the system pattern in the recovered data, then the control circuit switches the PLL 210 to the training mode. Typically, the control circuit 270 is removed from the PLL 210, although, for simplicity in FIG. 2, the control circuit 270 is shown as part of PLL 210.

The phase-frequency detector 222 compares the signal at its first input 218 to the signal at its second input 248. Based on the result of the comparison, the phase-frequency detector 222 provides an output signal to charge pump 226. This output signal has the effect of tending to reduce the frequency and phase differences between the signals of inputs 218, 248 by adjusting the frequency of the output clock signal 238 of the VCO 234, as further discussed below. The output signal of the phase-frequency detector 222 is a voltage signal that is a function of the difference in frequency and phase of the signals available at first and second inputs 218, 248 of the phase-frequency detector 222.

The output signal of the phase-frequency detector 222 can have one of three states. When the signal at the first input 218 has a frequency greater than the frequency of the signal present at the second input 248, then the output voltage signal of the phase-frequency detector 222 will be at a high voltage level, such as 5 volts. The length of time that the output voltage of phase-frequency detector 222 will be at the high voltage is proportional to the magnitude of the difference in frequencies of the signals present at the first and second inputs 218, 248. When the frequencies (and phases) of the signals present at the first and second inputs 218, 248 are equal, then the phase-frequency detector 222 will provide an output signal of 0 volts. Finally, when the frequency of the signal present at input 218 is less than the frequency of the signal present at input 248, then the output signal of the phase-frequency detector 222 is a negative voltage. Similar to the converse case, the duration of the negative output voltage signal of the phase-frequency detector 222 is proportional to the magnitude of the difference between the frequencies of the signals present at inputs 218, 248.

Phase differences of signals at one frequency at inputs 218, 248 have a similar effect on the output signal of phase-frequency detector 222. Phase-frequency detectors are discussed in Chapter 3 entitled "The Classical Digital PLL (DPLL)" of the Second Edition of *Phase-Locked Loops Theory, Design and Applications,* by Roland E. Best, published by McGraw-Hill, Inc., 1993, which is hereby incorporated by reference.

The output voltage of the phase-frequency detector 222, whether positive, zero, or negative, is converted by the charge pump 226 into a current, which is filtered by the loop filter 230 and transformed into a voltage signal. The output voltage signal of the loop filter 230 controls the frequency of the output clock signal 238 of the VCO 234. So, when that voltage equals, for example, zero, then the frequency of the output clock signal 238 will equal the center frequency of the VCO 234. Since the phase-frequency detector 222 attempts to equalize the frequencies and phases of signals at its inputs 218, 248 by providing an output signal that ultimately controls the VCO 234, the relationship between the frequencies of signals at inputs 218, 248 can be expressed as shown below in Equation 1:

$$f(output) = f(LO) M/N \qquad (1)$$

Per Equation 1, the frequency of the output clock signal 238 equals the frequency of the training clock signal 260 of the local oscillator 258 multiplied by the divisor M of divider 266 and divided by the divisor N of divider 262. Consequently, by selecting appropriate values of divisors M, N of dividers 266, 262, respectively, the frequency of the output clock signal 238 can be made to substantially equal the frequency of the expected clock signal of the data signal 214.

Indeed, the greater the precision with which divisors M, N are provided, the closer the PLL 210 can make the frequency of the output clock signal 238 to the frequency of the clock of data signal 214. Therefore, when dividers 266, 262 are implemented with counters, then higher modulus counters will provide divisors M, N with greater precision than lower modulus counters of the same type.

Alternatively, control circuit 270 can set divisors M, N equal to one. Then the frequency of the output clock 238 is made equal to the frequency of the clock signal of data signal 214 by setting the frequency of the training clock signal 260 equal to the frequency of the clock signal of data signal 214. This approach of setting divisors M, N equal to one, however, is limited by the ability of the local oscillator 258 to provide a training clock signal 260 over the appropriate frequency range of expected clock signals of data signal 214.

So, PLL 210, in the training mode, operates to equalize the frequencies of output clock signal 238 with the expected clock signal frequency of data signal 214. Once data signal 214 again becomes available, the control circuit 270 provides the training control signal 274 that switches MUX1 and MUX2 into the data receiving mode. In the data receiving mode, the phase-frequency detector 222 receives at its first input 218 the data signal 214 with its embedded clock information. At its second input 248, the phase-frequency detector 222 receives the output clock signal 238 from the output of the VCO 234 without having been divided by divider 266. When the PLL 210, in the training mode, had sufficient time to equalize frequencies of the clock of data 214 with the frequency of the output clock 238, then the phase-frequency detector 222 merely equalizes the phases of the embedded clock signal information of data signal 214 with that of the output clock signal 238. In this case, the PLL 210 need not waste time on equalizing frequencies. Even when frequency equalization by PLL 210 in the training mode is only partial, still partial time savings will be realized in the clock signal recovery. As discussed above, the phase-frequency detector 222 equalizes these phases by providing the appropriate voltage signal at its output.

Phase-frequency detectors 222 typically are unable to correctly compare frequencies and phases of two signals where one of the signals has missing pulses. Missing pulses can arise when the data signal 214 has, for instance, a series of logic zeros in between logic ones. As discussed above, in one format, only logic ones are represented by low-high-low voltage transitions. Logic zeros are represented by no transitions at all.

Having the pulse gate circuit 220 between the outputs of MUX1 and MUX2 and first and second inputs 218, 248 of phase-frequency detector 222 eliminates the possible problem of skipped pulses in the data signal 214. The pulse gate circuit 220 is activated by the control circuit 270. As mentioned above, the pulse gate circuit 220 compares the data signal 214 with the output signal of MUX2 and removes pulses in the output signal of MUX2, whenever there is no corresponding pulse present in the data signal 214. But, while PLL 210 is in the training mode, control circuit 270 disables the pulse gate circuit 220. In the training mode, there is no need for removing pulses, since the local oscillator 258 provides at its output a continuous series of pulses in the form of the training clock signal 260.

Several preferred embodiments of the present invention have been described. Nevertheless, it will be understood that various modifications may be made without departing from the spirit and scope of the invention. For example, the discussion above has been in terms of clock signal recovery. However, it will be clear to one of ordinary skill in the art based upon the above description that in other embodiments, for example, the invention can be applied generally, i.e., whenever a fast frequency and phase lock is desired.

Figure 3:
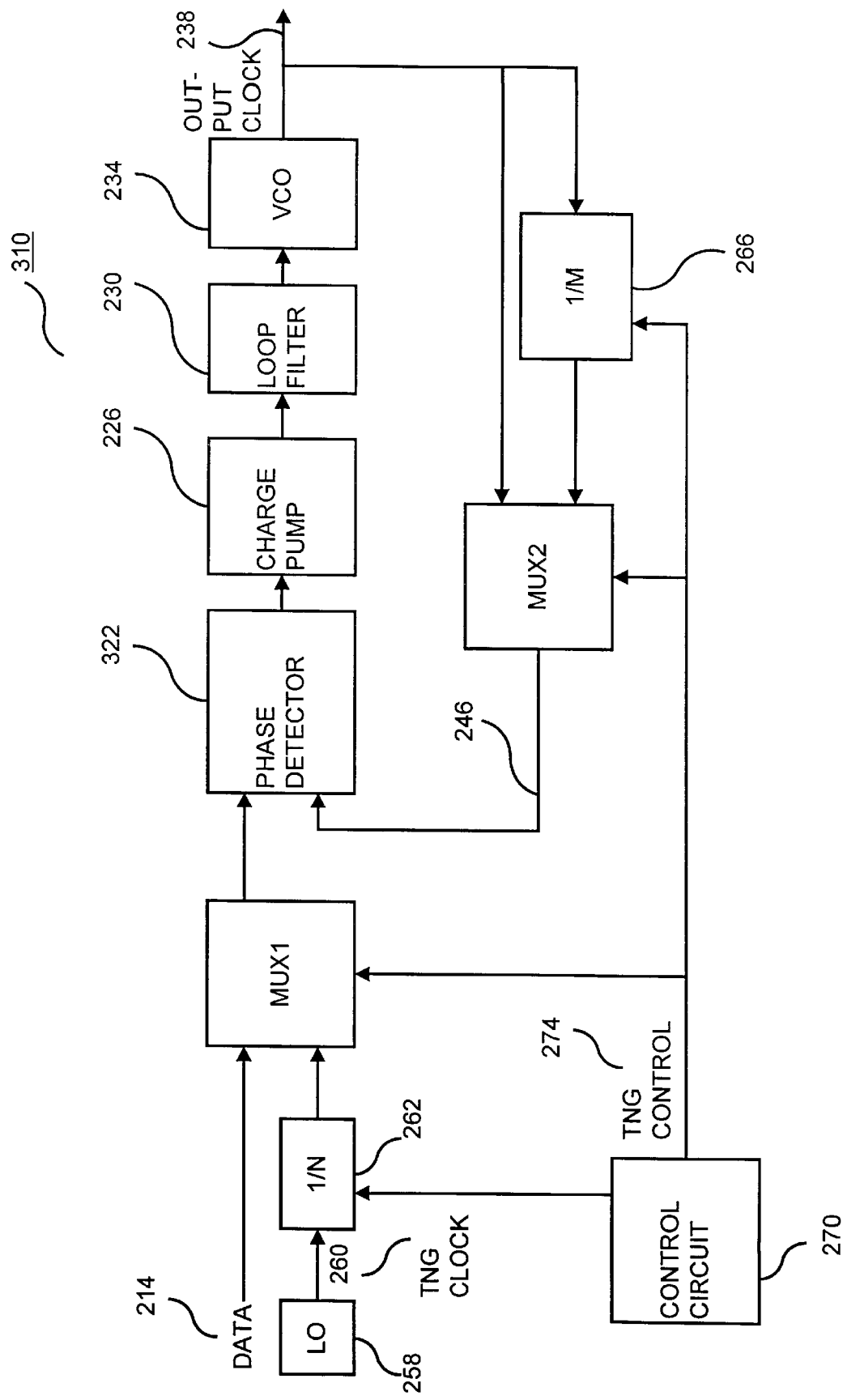
FIG. 3 is a block diagram of a phase-locked loop with training capability, in accordance with another preferred embodiment of the invention.

Similarly, one of ordinary skill in the art will understand based on the description herein that the phase-locked loops described above can be implemented in various ways. For instance, the phase-frequency detector 222 can be replaced with simply a phase detector. Having a phase detector only, is feasible, for example, when the frequencies of the signals at outputs 219 and 221 are relatively close to each other. For instance, the frequency of the signal at output 219 may be less than the frequency at output 221. But the frequency at output 221 may still be less than twice the frequency at output 219. Use of a phase detector 322 in place of the phase-frequency detector 222 simplifies the PLL of FIG. 2. In PLL 210 of FIG. 2, the pulse gate circuit 220 can be omitted resulting in simplified PLL 310, as shown in FIG. 3. Also, as shown in FIG. 3, MUX1 and MUX2 are directly connected to the phase detector 322.

In further embodiments, the VCO 234 can be replaced with a current-controlled oscillator. Similarly, the phase-frequency detector 222 would be replaced with a type that provides a controlled current source at its output. The remaining components of PLL 210 also would be modified as appropriate. Moreover, in another embodiment, the charge pump 222 and analog loop filter 230 combination can be replaced simply with a digital filter. Indeed, in other embodiments, the entire phase-locked loop can be implemented in a computer program executed by a, for instance, microprocessor or a digital signal processor. Thus the present invention is not limited to the preferred embodiments described herein, but may be altered in a variety of ways, which will be apparent to a person skilled in the art based on the present description.

What is claimed is:

1. A method for acquiring frequency and phase lock comprising:

receiving a local oscillator signal;

receiving an output clock signal;

modifying the output clock signal according to a function to generate a modified output clock signal;

causing a detector to compare the local oscillator signal with the modified output clock signal;

adjusting the frequency of the output clock signal based on the comparison between the modified output clock signal and the local oscillator signal to generate an adjusted output clock signal having a frequency substantially equal to an expected data signal frequency;

receiving a data signal having an actual data signal frequency substantially equal to the expected data signal frequency;

causing the detector to compare the phase of the data signal with the phase of the adjusted output clock signal; and adjusting the adjusted output clock signal based on the comparison between the phase of the data signal with the phase of the adjusted output clock signal.

2. The method of claim 1, wherein comparing the local oscillator signal with the modified output clock signal includes comparing the phase of the local oscillator signal with the phase of the modified output clock signal.

3. The method of claim 2, further comprising adjusting the frequency of the adjusted output clock signal based on the comparison of the phase of the data signal with the phase of the output clock signal.

4. A method for acquiring frequency and phase lock comprising:

selecting a local oscillator signal for input to a detector, the detector being coupled to a clock generator which provides an output clock signal;

adjusting the frequency of the output clock signal based on the frequency of the selected local oscillator signal to generate an adjusted output clock signal having a frequency substantially equal to an expected data signal frequency;

selecting a data signal for input to the detector, the selected data signal having a frequency substantially equal to the expected data signal frequency; and adjusting the phase of the adjusted output clock signal based on the phase of the selected data signal.

5. The method of claims further comprising generating a control signal indicative of the availability of the data signal.

* * * * *

UNITED STATES PATENT AND TRADEMARK OFFICE
CERTIFICATE OF CORRECTION

PATENT NO. : 6,295,327 B1 Page 1 of 1
DATED : September 25, 2001
INVENTOR(S) : Ashraf K. Takla It is certified that error appears in the above-identified patent and that said Letters Patent is hereby corrected as shown below:

<u>Column 8,</u>
Line 46, change "The method of claims further comprising" to -- The method of claim 4 further comprising --

Signed and Sealed this

Fourteenth Day of May, 2002

*Attest:*

*Attesting Officer*

JAMES E. ROGAN
*Director of the United States Patent and Trademark Office*